United States Patent
Ren et al.

(10) Patent No.: US 10,644,148 B2
(45) Date of Patent: May 5, 2020

(54) ACTIVE SEMICONDUCTOR DEVICE ON HIGH-RESISTIVITY SUBSTRATE AND METHOD THEREFOR

(71) Applicant: NXP USA, Inc., Austin, TX (US)

(72) Inventors: Xiaowei Ren, Plano, TX (US); Hernan Rueda, Chandler, AZ (US); Rodney Arlan Barksdale, Buda, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/002,354

(22) Filed: Jun. 7, 2018

(65) Prior Publication Data

US 2019/0378923 A1  Dec. 12, 2019

(51) Int. Cl.
*H01L 29/78* (2006.01)
*H01L 29/167* (2006.01)
*H01L 29/10* (2006.01)
*H01L 29/66* (2006.01)

(52) U.S. Cl.
CPC ...... *H01L 29/7816* (2013.01); *H01L 29/1079* (2013.01); *H01L 29/167* (2013.01); *H01L 29/66681* (2013.01)

(58) Field of Classification Search
CPC ............... H01L 29/7811–7826; H01L 29/66681–66704; H01L 29/66568–66659; H01L 29/0619–0623; H01L 23/522
See application file for complete search history.

(56) References Cited

U.S. PATENT DOCUMENTS

| | | | |
|---|---|---|---|
| 6,114,732 A * | 9/2000 | Sugimura | H01L 29/78651 257/365 |
| 9,653,410 B1 * | 5/2017 | Holmes | H01L 23/66 |
| 2010/0032758 A1 * | 2/2010 | Wang | H01L 29/1095 257/343 |
| 2011/0102077 A1 * | 5/2011 | Lamey | H01L 23/4824 327/594 |
| 2014/0003000 A1 | 1/2014 | McPartlin | |
| 2015/0270333 A1 * | 9/2015 | Yang | H01L 29/063 257/337 |
| 2016/0141365 A1 * | 5/2016 | Campi, Jr. | H01L 29/66712 257/329 |

(Continued)

OTHER PUBLICATIONS

Ben Salah, Miled et al; "A New 3D-PICS High Density Integrated Passive Device with Substrate Noise Reduction by localized P+ Guard Rings: Characterization and Modeling"; Proc of the 2014 Int'l Symposium on Electromagnetic Compatability, Gothenburg, Sweden, Sep. 1-4, 2014; 4 pages (2014).

(Continued)

*Primary Examiner* — Nelson Garces
(74) *Attorney, Agent, or Firm* — Charlene R. Jacobsen

(57) ABSTRACT

An active semiconductor device, such as a laterally diffused metal oxide semiconductor (LDMOS) transistor, includes a substrate having a substrate resistivity of at least 1 kohm-cm. An active area of the active semiconductor device is formed in the substrate. A doped implant region is formed in the substrate surrounding the active area of the active semiconductor device and a field oxide region is formed over the doped implant region. The doped implant region may include a boron dopant. Methodology entails forming the doped implant region prior to formation of the field oxide region.

20 Claims, 3 Drawing Sheets

(56) References Cited

U.S. PATENT DOCUMENTS

2017/0373187 A1* 12/2017 Birner .............. H01L 21/76804

OTHER PUBLICATIONS

Schrimpf, R.D. et al; "High-Voltage Termination-Structure Design Using a Test Chip and Two-Dimensional Simulation"; Proc. IEEE Int. Conference on Microelectronic Test Structures, vol. 6; 5 pages (Mar. 1993).

* cited by examiner

ACTIVE SEMICONDUCTOR DEVICE ON HIGH-RESISTIVITY SUBSTRATE AND METHOD THEREFOR

TECHNICAL FIELD OF THE INVENTION

The present invention relates generally to active semiconductor devices. More specifically, the present invention relates to an active semiconductor device, such as a laterally diffused metal oxide semiconductor (LDMOS) transistor, on high-resistivity substrate and method therefor.

BACKGROUND OF THE INVENTION

Active semiconductor devices, such as laterally diffused metal oxide semiconductor (LDMOS) transistors, are often used in high power analog circuits. For example, an application for LDMOS transistors and other active semiconductor devices is in radio frequency (RF) power amplifiers. High-resistivity silicon (e.g., greater than 1 kohm-cm) substrate is increasingly being used in RF power amplifiers because it reduces substrate RF power loss, thus conferring considerable benefits to the active and passive elements of an RF system. In such RF systems, low loss and high performance is essential. However, unacceptably high drain current leakage and low breakdown voltage conditions have been observed in some active semiconductor device layouts processed on high-resistivity substrates.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns an active semiconductor device, such as a laterally diffused metal oxide semiconductor (LDMOS) transistor, on high-resistivity substrate (e.g., substrate resistivity of at least 1 kohm-cm) and fabrication methodology. More particularly, a relatively deep doped implant region is formed in the high-resistivity substrate surrounding an active area of the active semiconductor device and underlying a field oxide region. The doped implant region may effectively reduce the drain current leakage and increase the breakdown voltage in a conventional LDMOS device layout that includes an array of long and paralleled gate fingers with shared source and drain on each side. The methodology for forming the LDMOS transistor can yield high performance, while concurrently saving development resources and cost.

In a non-limiting fashion, the following description entails the implementation of a doped implant region formed in the high-resistivity substrate surrounding the active area of an LDMOS transistor and underlying a field oxide region. In alternative embodiments, the doped implant region and methodology described herein to form the doped implant region may be implemented on other active semiconductor devices (e.g. ESD devices, thermal tracking devices, CMOS FETs, RF bipolar devices, and so forth) having a field oxide region and processed on the high-resistivity substrate.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
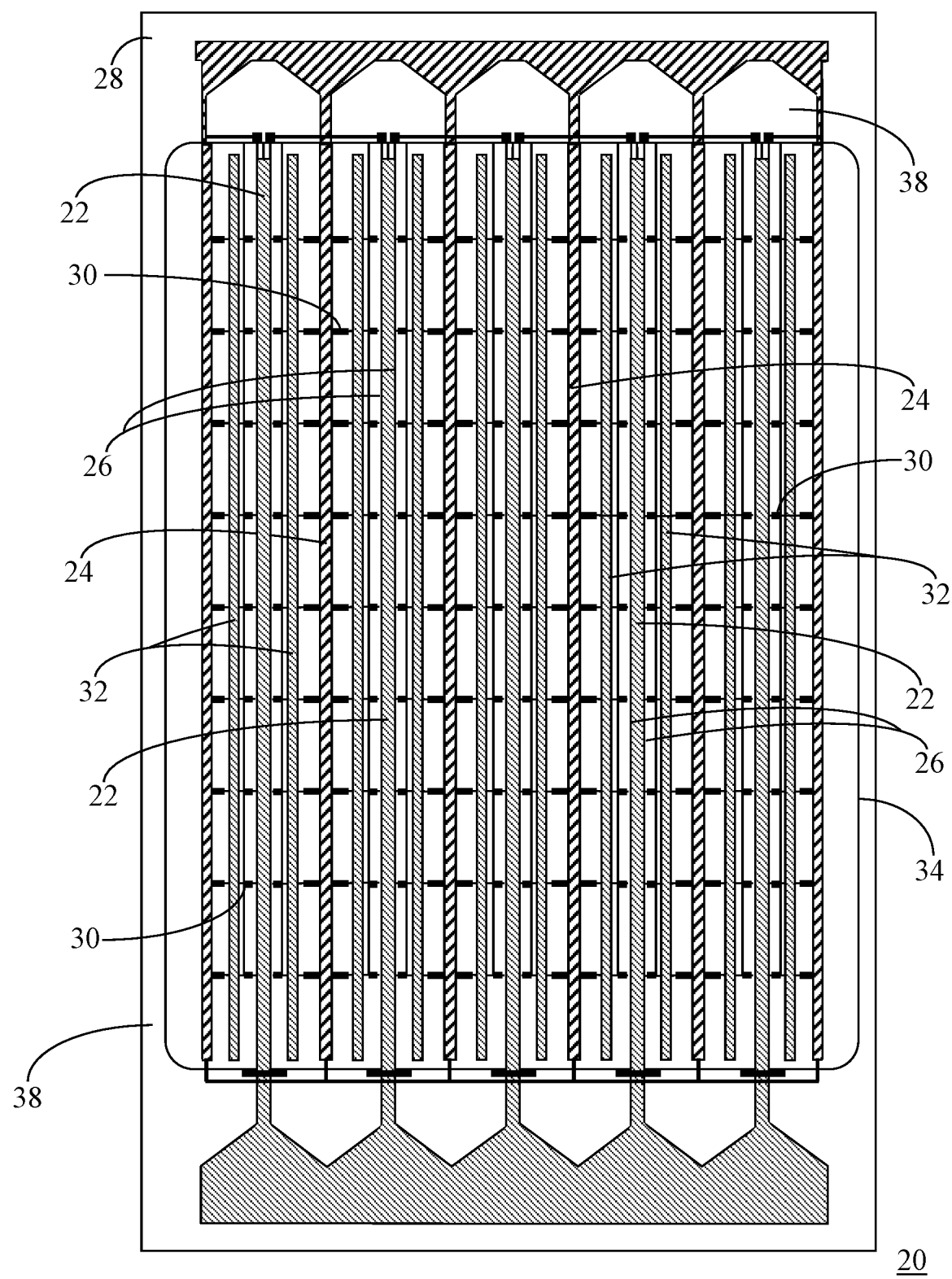
FIG. 1 shows a simplified top view of an example of a laterally diffused metal oxide semiconductor (LDMOS) transistor having interdigitated drain and gate fingers.

FIG. 1 shows a simplified top view of an example of a laterally diffused metal oxide semiconductor (LDMOS) transistor 20 having interdigitated drain and gate runners 22, 24. That is, drain and gate runners 22, 24 are closely positioned relative to one another in an alternating arrangement. Gates 26 may be adjacent to the drain formed within a semiconductor substrate 28 of an intrinsic device underlying drain and gate runners 22, 24. LDMOS transistor 20 further includes a plurality of tap interconnects 30 formed from electrically conductive material, typically metal. Tap interconnects 30 are electrically connected between gate runners 24 and gate taps or gate electrodes of gates 26 formed above semiconductor substrate 28. LDMOS transistor 20 may further include shield runners 32 interposed between each pair of drain and gate runners 22, 24 that may reduce some feedback capacitance between drain and gate runners 22, 24. The interdigitated drain, gate, and shield runners 22, 24, 32 may be formed in one or more metal layers above semiconductor substrate 28. The structures of LDMOS transistor 20 formed in semiconductor substrate 28 below drain, gate, and shield runners 22, 24, 32 are not visible in the top view example of FIG. 1.

Semiconductor substrate 28 may have a substrate resistivity of at least 1 kohm-cm. A substrate having a substrate resistivity of at least 1 kohm-cm is commonly referred to as a high-resistivity substrate. High-resistivity substrates are increasingly being implemented in radio frequency (RF) applications to enable low loss, high performance components that are key elements in RF systems. Some devices that may benefit from implementation with high-resistivity substrates include RF LDMOS, RF MEMS switches, BiC- MOS, transmitters and receivers, GHz mixers, passive devices, and so forth. Accordingly, semiconductor substrate 28 is referred to hereinafter as high-resistivity substrate 28.

A box delineates an active area 34 of LDMOS transistor 20 formed in high-resistivity substrate 28, with drain, gate, and shield runners 22, 24, 32 being formed over active area 34 of LDMOS transistor 20. In some configuration, active area 34 is typically surrounded by an isolation region formed from, for example, a field oxide. This isolation region may alternatively be referred to herein as field oxide region 38. Gate runners 24 and gates 26 are terminated on field oxide region 38 at each end of gate runners 24 and gates 26. Field oxide region 38 may be approximately 5000 Angstroms to 1 micron thick and recessed into high-resistivity substrate 28. Field oxide region 38 provides the dielectric isolation to the active device and the E-field termination to the drain. A local oxidation of silicon (LOCOS) field oxide process may be utilized to form the field oxide with a high-resistivity substrate. In general, LOCOS is a microfabrication process in which an oxide (e.g., silicon dioxide) is formed on a silicon wafer. Through a thermal oxidation technique, oxygen penetrates into the silicon wafer at high temperature, reacts with the silicon, and transforms the silicon into silicon oxide to form an insulating structure. This thermally grown silicon oxide may be used as the field oxide to provide dielectric isolation to the active device and E-field termination to the source and the drain. It has been observed that abnormal performance occurs in RF LDMOS transistors with the conventional finger layout (shown in FIG. 1) processed on a high-resistivity substrate. In particular, drain current leakage, $I_{DS}$, increased sharply and breakdown voltage, $BV_{DS}$, dropped relative to RF LDMOS transistors processed on conventional silicon substrate (e.g., 8 mohm-cm substrate).

Figure 2:
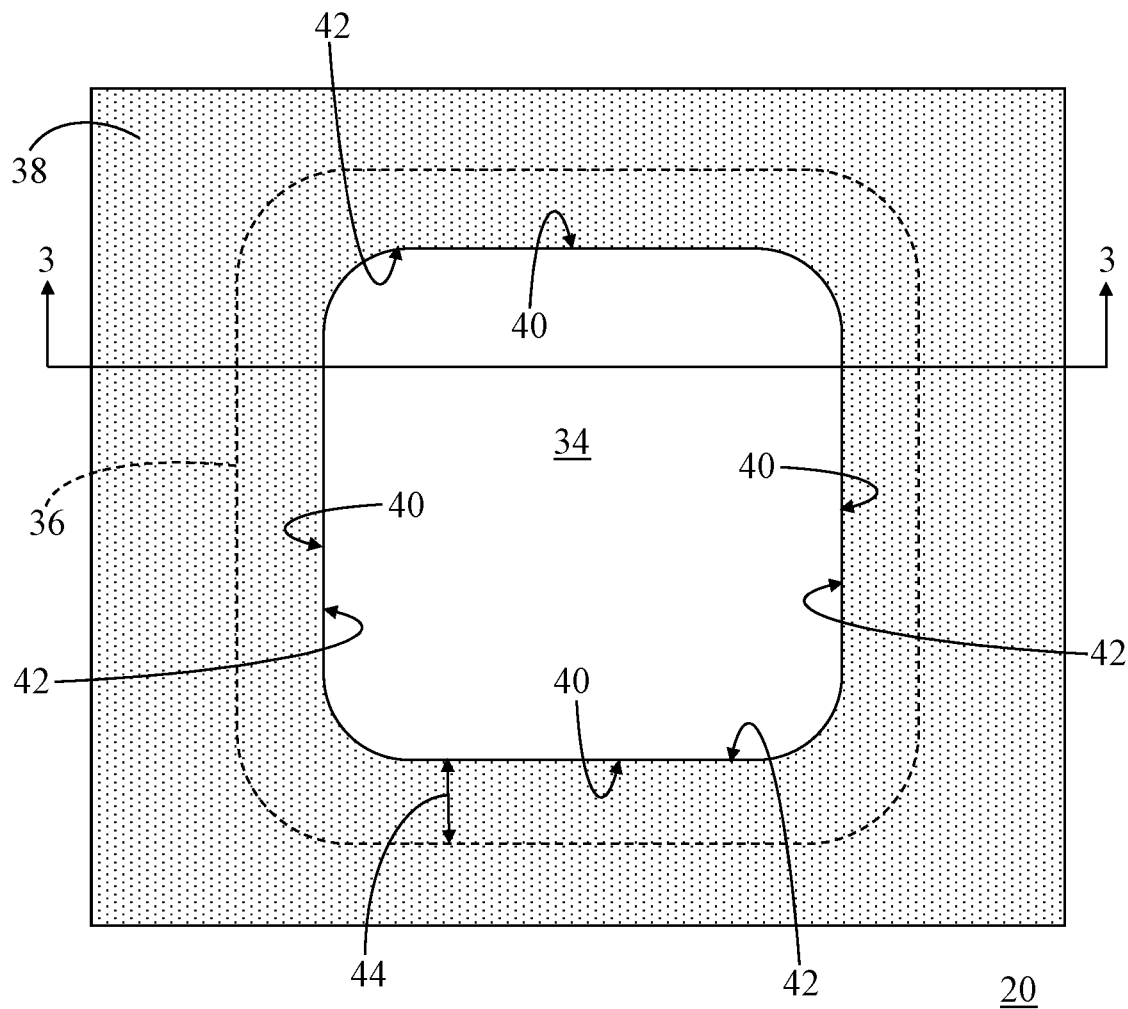
FIG. 2 shows a representative top view of an LDMOS transistor in accordance with an embodiment.
Figure 3:
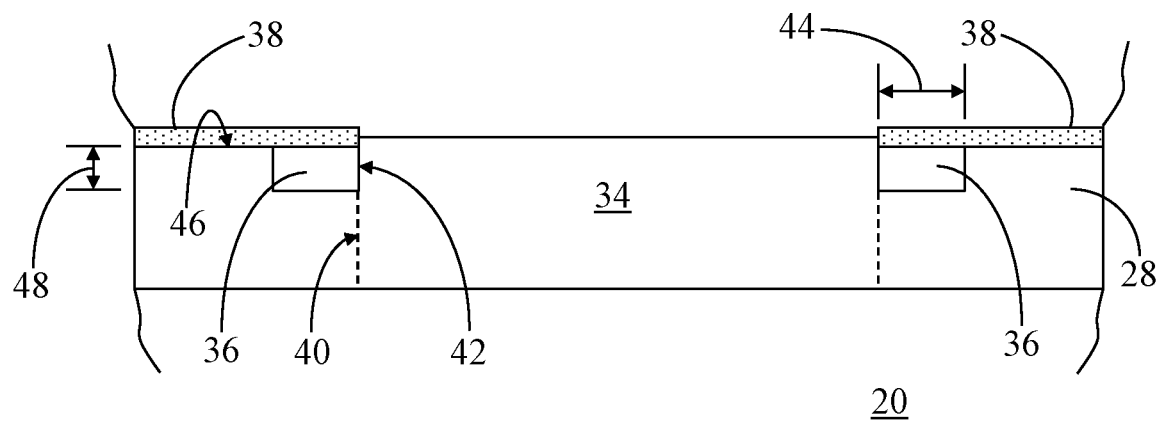
FIG. 3 shows a side sectional view of the LDMOS transistor of along section lines 3-3 of FIG. 2.

Referring now to FIGS. 2-3, FIG. 2 shows a representative top view of an active semiconductor device in accordance with an embodiment and FIG. 3 shows a side sectional view of the active semiconductor device along section lines 3-3 of FIG. 2. In this example, the active semiconductor device may be LDMOS transistor 20 processed on high-resistivity substrate 28. However, as discussed previously, the active semiconductor device represents any of a variety of devices having a field oxide region and processed on a high-resistivity substrate.

As mentioned previously, high-resistivity substrate 28 has a substrate resistivity of at least 1 kohm-cm and active area 34 of LDMOS transistor 20 is formed in high-resistivity substrate 28. Active area 34 may include drain, source, and channel regions for LDMOS transistor 20 formed therein. For brevity, the various features within active area 34 are not illustrated and not described in detail herein. In accordance with an embodiment, LDMOS transistor 20 further includes a doped implant region 36 formed in high-resistivity substrate 28 and surrounding active area 34 of LDMOS transistor 20. Field oxide region 38 is formed over doped implant region 36. Doped implant region 36 is hidden from view in FIG. 2 by the overlying field oxide region 38. Hence, doped implant region 36 is shown in dashed line format in FIG. 2 due to its location below field oxide region 38.

In some embodiments, doped implant region 36 fully surrounds an outer perimeter 40 of active area 34. Further, an inner perimeter 42 of doped implant region 36 is immediately adjacent to outer perimeter 40 of active area 34. Doped implant region 36 exhibits a width 44 in a direction parallel to a surface 46 of high-resistivity substrate 28 and a depth 48 into high-resistivity substrate 28 that is perpendicular to surface 46 of substrate 28. In a non-limiting fashion, width 44 of doped implant region 36 may be approximately 20 microns and depth 48 of doped implant region 36 may be approximately 5 microns. This ring of doped implant region 36 should be connected to a device ground of LDMOS transistor 20. In some embodiments, such as the illustrated LDMOS transistor 20, a source side P-well within active area 34 and in contact with doped implant region 36 may serve as the device ground for LDMOS transistor 20 to which doped implant region 36 is connected. Alternative embodiments may implement a different configuration for connecting doped implant region 36 to a device ground of the active semiconductor device.

In some embodiments, doped implant region 36 comprises a P-type dopant, also referred to as a doping agent. In an example, doped implant region 36 comprises a boron dopant. However, other substances may be utilized as a p-type dopant, such as aluminum, gallium, indium, and so forth in accordance with a particular process flow. The boron dopant in doped implant region 36 may have a doping concentration, or dopant density, that is at least an order of magnitude greater than a doping concentration of high-resistivity substrate 28.

Doped implant region 36 forms a ring surrounding active area 34 of LDMOS transistor 20 and can function to reduce drain current leakage, $I_{DS}$, to values similar to those achieved on a conventional silicon substrate (e.g., 8 mohm-cm substrate). Additionally, doped implant region 36 can function to increase the breakdown voltage, $BV_{DS}$, to values similar to those achieved on a conventional silicon substrate (e.g., 8 mohm-cm substrate).

Figure 4:
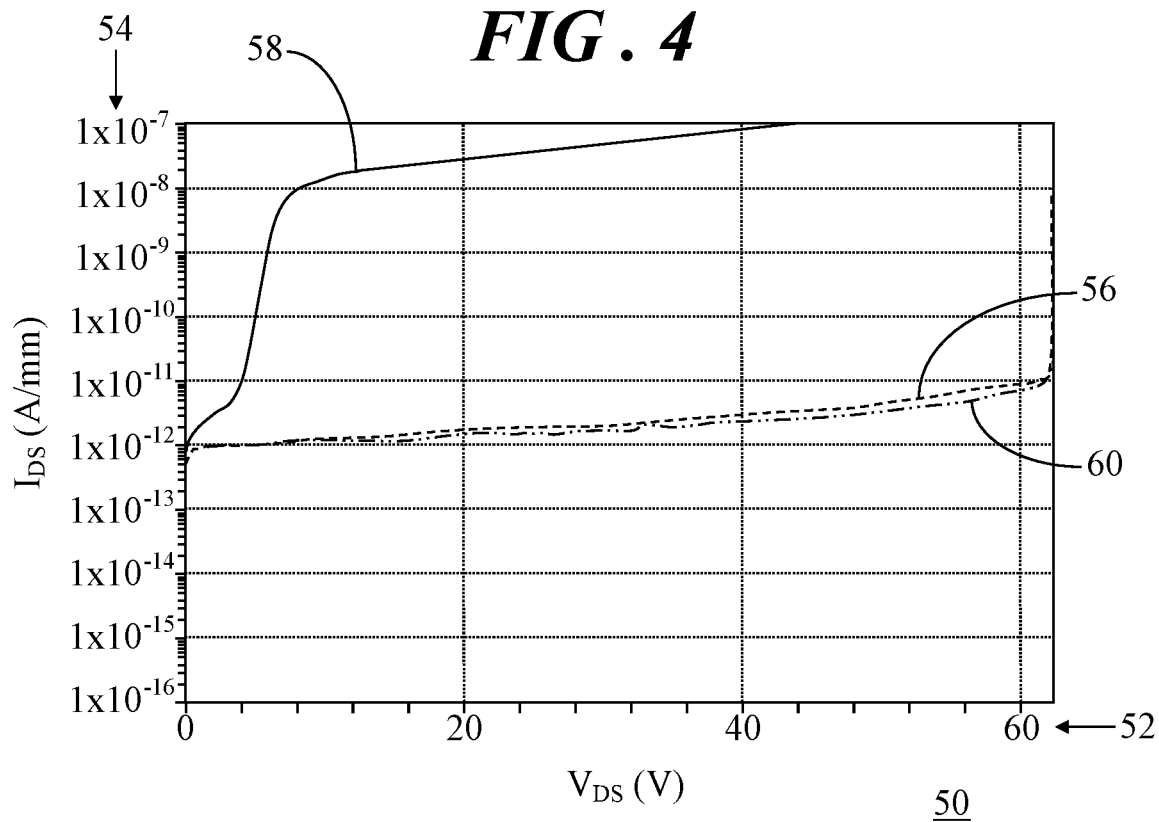
FIG. 4 shows a graph of current leakage curves over drain voltage.

FIG. 4 shows a graph 50 of simulated current leakage curves over drain voltage. In graph 50, a drain voltage range 52, labeled $V_{DS}$, is on the horizontal axis and a leakage current range 54, labeled $I_{DS}$, is on the vertical axis. A first current leakage curve 56 represents the leakage current over the drain voltage for an LDMOS transistor processed on a conventional silicon substrate (e.g., 8 mohm-cm substrate). A second current leakage curve 58 represents the leakage current over the drain voltage for an LDMOS transistor processed on a high-resistivity substrate without the surrounding ring of doped implant region 36 (FIGS. 2-3). A third current leakage curve 60 represents the leakage current over the drain voltage for LDMOS transistor 20 processed on high-resistivity substrate 28 that includes doped implant region 36.

As shown in graph 50 from the simulated results, third current leakage curve 60 for LDMOS transistor 20 processed on high-resistivity substrate 28 that includes doped implant region 36 can be effectively reduced from about 4-5 orders of magnitude relative to second leakage curve 58 for an LDMOS transistor processed on a high-resistivity substrate without doped implant region 36. As further shown in graph 50 from the simulated results, third current leakage curve 60 for LDMOS transistor 20 processed on high-resistivity substrate 28 that includes doped implant region 36 is similar to first current leakage curve 56 for an LDMOS transistor processed on a conventional silicon substrate (e.g., 8 mohm-cm substrate). Thus, significant improvements in leakage current are gained with the inclusion of doped implant region 36 while additionally achieving the performance benefits from high-resistivity substrate 28.

Additionally, simulations show that the breakdown voltage, $BV_{DS}$, for LDMOS transistor 20 processed on high-resistivity substrate 28 that includes doped implant region 36 is significantly higher than the breakdown voltage, $BV_{DS}$, for an LDMOS transistor processed on a high-resistivity substrate without doped implant region 36. Indeed, the breakdown voltage, $BV_{DS}$, for LDMOS transistor 20 processed on high-resistivity substrate 28 that includes doped implant region 36 is approximately equivalent to an LDMOS transistor processed on a conventional silicon substrate (e.g., 8 mohm-cm substrate). As such, significant improvements in breakdown voltage performance are gained with the inclusion of doped implant region 36 while additionally achieving the performance benefits from high-resistivity substrate 28.

Figure 5:
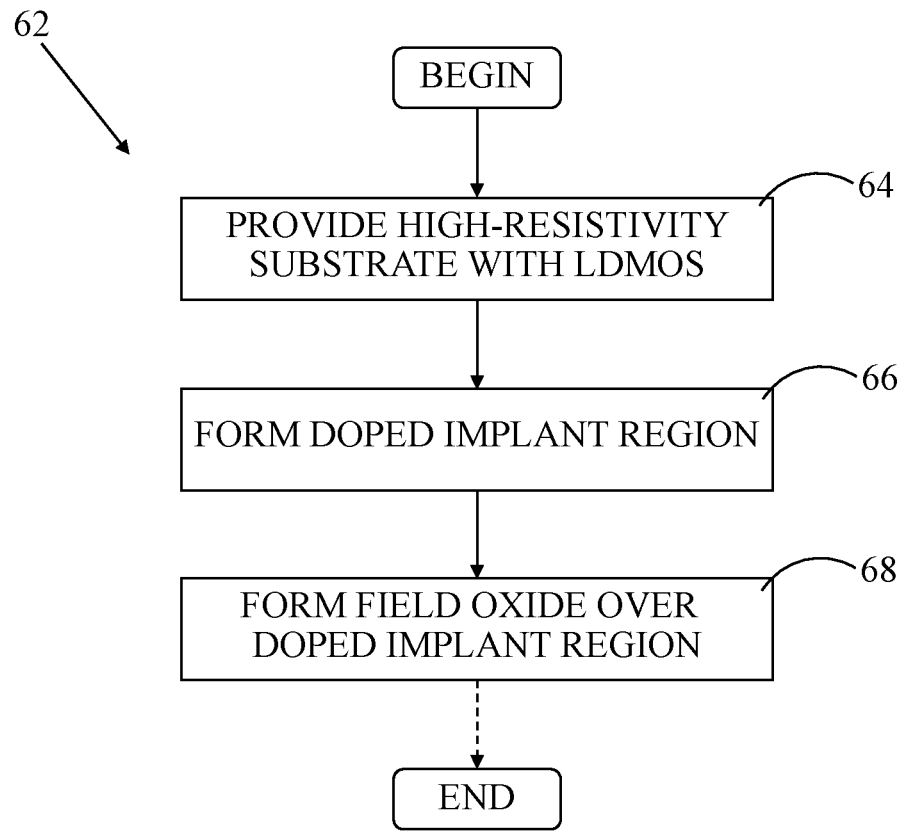
FIG. 5 shows a flowchart of a fabrication process in accordance with another embodiment

FIG. 5 shows a flowchart of a fabrication process 62 in accordance with another embodiment. Fabrication process 62 may be implemented for processing one or more LDMOS transistors, such as LDMOS transistor 20 (FIGS. 2-3), to include doped implant region 36. Thus, reference can be made to FIGS. 2-3 in conjunction with fabrication process 62. Further, fabrication process 62 can be readily adapted for processing one or more active semiconductor devices having a field oxidation region and processed on the high-resistivity substrate to include doped implant region 36 and an electrical device ground.

Process 62 may begin at a block 64 by providing a high-resistivity substrate (e.g., high-resistivity substrate 28) having one or more intrinsic active devices (e.g., LDMOS transistor 20). Detailed process operations for forming the features of LDMOS transistor 20 in active area 34 of high-resistivity substrate 28 are outside the scope of the detailed description and are hence not described herein for brevity.

In a block 66, a doped implant region (e.g., doped implant region 36) is formed surrounding the active area (e.g., active area 34) of the active semiconductor device (e.g., LDMOS transistor 20). In an example, a boron implant module may be added to the conventional LDMOS transistor 20 process flow. Of course, suitable dopants other than a boron dopant may alternatively be used. The boron implant module may include addition of a mask layer for the boron implant, implantation of the boron dopant, and removal of the mask layer. In some embodiments, an implantation energy for the boron dopant may be approximately 500 kiloelectronvolts (KeV) and the implant dose may be $3 \times 10^{11}$ or higher. The dopant should be implanted into the high-resistivity substrate at a depth sufficient that the dopant is not fully consumed by field oxidation during formation of the field oxide region at a subsequent block 68. Further, the implant dose should be sufficient such that a doping concentration of the dopant is at least an order of magnitude greater than the substrate doping concentration of the high-resistivity substrate (e.g., high resistivity substrate 28) following formation of the field oxide region at block 68. Still further, the implant dose should be sufficient such that a resulting resistivity of the doped implant region is at least an order of magnitude less than the substrate resistivity of the high-resistivity substrate.

The implant ring of doped implant region 36 can be aligned to outer perimeter 40 of active area 34 and can extend outward by width 44 and into high-resistivity substrate 28 by depth 48. Additionally, the implant ring of doped implant region 36 should be connected to a device ground of the active semiconductor device. In this example, doped implant region 36 may be connected via direct physical contact with a source side P-well within active area 34 of LDMOS transistor 20 such that the source side P-well serves as the device ground for LDMOS transistor 20.

Following formation of the doped implant region at block 66, block 68 is performed. At block 68, a field oxide region (e.g., field oxide region 38) may be formed over and extend laterally beyond the doped implant region. The field oxide region may be formed by a LOCOS process or any other suitable process. Thereafter, process 62 may continue with additional process operations as dented by a dashed line exiting block 68 until fabrication process 62 is complete. These additional process operations may entail dielectric and metal buildup layers in active area 34 to yield, for example, drain, gate, and shield runners 22, 24, 32, gates 26, tap interconnects 30, and so forth.

Embodiments described herein entail an active semiconductor device, such as a laterally diffused metal oxide semiconductor (LDMOS) transistor, on high-resistivity substrate (e.g., substrate resistivity of at least 1 kohm-cm) and fabrication methodology. An embodiment of an active semiconductor device comprises a substrate having a substrate resistivity of at least 1 kohm-cm, an active area of the active semiconductor device formed in the substrate, a doped implant region formed in the substrate surrounding the active area of the active semiconductor device, and a field oxide region formed over the doped implant region.

An embodiment of a method for forming active semiconductor device comprises providing a substrate having a substrate resistivity of at least 1 kohm-cm, wherein an active area of the active semiconductor device is formed therein, forming a doped implant region in the substrate surrounding the active area of the active semiconductor device, and forming a field oxide region over the doped implant region.

An embodiment of a laterally diffused metal oxide semiconductor (LDMOS) transistor comprises a substrate having a first resistivity of at least 1 kohm-cm, an active area of the LDMOS transistor formed in the substrate, a doped implant region formed in the substrate fully surrounding and adjacent to an outer perimeter of the active area of the LDMOS transistor, the doped implant region exhibiting a first doping concentration of a dopant in the doped implant region that is at least an order of magnitude greater than a second doping concentration of the substrate, wherein the doped implant region is connected to a device ground of the LDMOS transistor. A field oxide region is formed over the doped implant region.

Thus, a relatively deep doped implant region is formed in the high-resistivity substrate surrounding an active area of the active semiconductor device and underlying a field oxide region. The doped implant region may effectively reduce the drain current leakage and increase the breakdown voltage in a conventional LDMOS device layout that includes an array of long and paralleled gate fingers with shared source and drain on each side. The methodology for forming the LDMOS transistor can yield enhanced device performance, while concurrently saving development resources and cost.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An active semiconductor device comprising:
a substrate having a substrate resistivity of at least 1 kohm-cm;
an active area of the active semiconductor device formed in the substrate, wherein interdigitated drain, gate, and shield runners are formed over the active area;
a doped implant region formed in the substrate surrounding the active area of the active semiconductor device; and
a field oxide region formed over the doped implant region, the gate runners being terminated at the field oxide region at each end of the gate runners.

2. The active semiconductor device of claim 1 wherein the doped implant region is connected to a device ground for the active semiconductor device.

3. The active semiconductor device of claim 1 wherein the doped implant region fully surrounds an outer perimeter of the active area.

4. The active semiconductor device of claim 1 wherein an inner perimeter of the doped implant region is adjacent to an outer perimeter of the active area.

5. The active semiconductor device of claim 1 wherein the doped implant region exhibits a width in a direction parallel to a surface of the substrate and a depth into the substrate that is perpendicular to the surface of the substrate.

6. The active semiconductor device of claim 5 wherein the depth of the doped implant region is approximately 5 microns.

7. The active semiconductor device of claim 1 wherein the doped implant region comprises a P-type dopant.

8. The active semiconductor device of claim 1 wherein the doped implant region comprises a boron dopant.

9. The active semiconductor device of claim 1 wherein a first doping concentration of the P-type dopant in the doped implant region is at least an order of magnitude greater than a second doping concentration the P-type dopant of the substrate.

10. The active semiconductor device of claim 1 wherein the active semiconductor device comprises a laterally diffused metal oxide semiconductor (LDMOS) transistor.

11. A method for forming active semiconductor device comprising:
providing a substrate having a substrate resistivity of at least 1 kohm-cm, wherein an active area of the active semiconductor device is formed therein, and wherein interdigitated drain, gate, and shield runners are formed over the active area;
forming a doped implant region in the substrate surrounding the active area of the active semiconductor device; and
forming a field oxide region over the doped implant region, the gate runners being terminated at the field oxide region at each end of the gate runners.

12. The method of claim 11 further comprising connecting the doped implant region to a device ground for the active semiconductor device.

13. The method of claim 11 wherein forming the doped implant region comprises fully surrounding an outer perimeter of the active area.

14. The method of claim 11 wherein forming the doped implant region comprises aligning an inner perimeter of the doped implant region adjacent to an outer perimeter of the active area.

15. The method of claim 11 wherein forming the doped implant region comprises forming the doped implant region to have a width in a direction parallel to a surface of the substrate and a depth into the substrate that is perpendicular to the surface of the substrate.

16. The method of claim 11 wherein forming the doped implant region is performed prior to forming the field oxide region, and forming the doped implant region comprises implanting a dopant into the substrate such that a first doping concentration of the doped implant region is at least an order of magnitude greater than a second doping concentration of the substrate following formation of the field oxide region.

17. The method of claim 16 wherein implanting the dopant comprises utilizing an implant energy of approximately 500 kiloelectronvolts (KeV) for implanting the boron dopant.

18. The method of claim 11 wherein forming the doped implant region is performed prior to forming the field oxide region, and forming the doped implant region comprises implanting a dopant into the substrate at a depth sufficient that the dopant is not fully consumed by field oxidation during formation of the field oxide region.

19. A laterally diffused metal oxide semiconductor (LDMOS) transistor comprising:
a substrate having a first resistivity of at least 1 kohm-cm;
an active area of the LDMOS transistor formed in the substrate, wherein interdigitated drain, gate, and shield runners are formed over the active area;
a doped implant region formed in the substrate fully surrounding and adjacent to an outer perimeter of the active area of the LDMOS transistor, the doped implant region exhibiting a first doping concentration of a dopant in the doped implant region that is at least an order of magnitude greater than a second doping concentration of the substrate, wherein the doped implant region is connected to a device ground of the LDMOS transistor; and
a field oxide region formed over the doped implant region, the gate runners being terminated at the field oxide region at each end of the gate runners.

20. The LDMOS transistor of claim 18 wherein the doped implant region comprises a boron dopant.

* * * * *